US008633377B2

(12) United States Patent
Winston et al.

(10) Patent No.: US 8,633,377 B2
(45) Date of Patent: Jan. 21, 2014

(54) LIGHT CONCENTRATION APPARATUS, SYSTEMS AND METHODS

(75) Inventors: Roland Winston, Merced, CA (US); Weiya Zhang, Merced, CA (US)

(73) Assignee: The Regents of the University of California, Oakland, CA (US)

( * ) Notice: Subject to any disclaimer, the term of this patent is extended or adjusted under 35 U.S.C. 154(b) by 219 days.

(21) Appl. No.: 13/126,152

(22) PCT Filed: Oct. 23, 2009

(86) PCT No.: PCT/US2009/061950
§ 371 (c)(1),
(2), (4) Date: Jul. 15, 2011

(87) PCT Pub. No.: WO2010/062532
PCT Pub. Date: Jun. 3, 2010

(65) Prior Publication Data
US 2011/0260037 A1 Oct. 27, 2011

Related U.S. Application Data

(60) Provisional application No. 61/108,696, filed on Oct. 27, 2008.

(51) Int. Cl.
*H01L 31/00* (2006.01)
*H01J 3/14* (2006.01)
(52) U.S. Cl.
USPC .......................................... 136/259; 250/216

(58) Field of Classification Search
USPC .......... 136/259; 359/641, 726, 728, 853, 858; 250/208.1, 216; 126/680, 683, 684, 126/698
See application file for complete search history.

(56) References Cited

U.S. PATENT DOCUMENTS

| 3,901,036 | A | * | 8/1975 | Martin .................. 60/641.15 |
| 3,902,792 | A | * | 9/1975 | Plummer .................. 359/718 |
| 4,114,592 | A | | 9/1978 | Winston |
| 4,282,862 | A | | 8/1981 | Soleau |
| 4,322,135 | A | | 3/1982 | Freeman |
| 4,345,586 | A | | 8/1982 | Monjes |
| 4,471,763 | A | | 9/1984 | Moravnik |
| 6,840,636 | B1 | | 1/2005 | Colvin |
| 7,244,924 | B2 | | 7/2007 | Kiyomoto et al. |
| 7,564,633 | B2 | | 7/2009 | Webb |
| 8,000,018 | B2 | | 8/2011 | Benitez et al. |
| 8,087,245 | B2 | | 1/2012 | Quero et al. |
| 8,101,855 | B2 | | 1/2012 | Benitez et al. |
| 8,355,214 | B2 | | 1/2013 | Winston et al. |
| 2003/0026002 | A1 | | 2/2003 | Lopez-Hernandez et al. |

(Continued)

OTHER PUBLICATIONS

Benitez, P. et al. (2010) "High Performance Fresnel-based Photovoltaic Concentrator," Optics Express 18(S1):1-16.

(Continued)

*Primary Examiner* — Thanh Luu
*Assistant Examiner* — Renee Naphas
(74) *Attorney, Agent, or Firm* — Foley & Lardner LLP; Antoinette F. Konski; Angela D. Murch

(57) ABSTRACT

An optical concentrator is disclosed which includes an imaging, aplanatic optical element having a front surface with a one-way light admitting portion, a back surface with a reflective portion, and an interior region of refractive material disposed between the front and backs surfaces.

4 Claims, 16 Drawing Sheets

(56) References Cited

U.S. PATENT DOCUMENTS

| | | |
|---|---|---|
| 2004/0218262 A1* | 11/2004 | Chuang et al. ............... 359/366 |
| 2004/0252390 A1 | 12/2004 | Benitez et al. |
| 2005/0088758 A1 | 4/2005 | Minano et al. |
| 2005/0179994 A1* | 8/2005 | Webb ........................ 359/352 |
| 2008/0092879 A1 | 4/2008 | Minano Dominguez et al. |
| 2008/0165437 A1* | 7/2008 | DiDomenico ............... 359/728 |
| 2009/0165842 A1 | 7/2009 | McDonald et al. |
| 2010/0116319 A1 | 5/2010 | Martinez Anton et al. |
| 2010/0116336 A1 | 5/2010 | Martinez Anton et al. |
| 2010/0307586 A1 | 12/2010 | Benitez et al. |
| 2011/0005577 A1 | 1/2011 | Medina et al. |
| 2012/0057324 A1 | 3/2012 | Martinez Anton |
| 2012/0132278 A1 | 5/2012 | Winston et al. |

OTHER PUBLICATIONS

Buljan, M. et al. "Improving Performances of Fresnel CPV Systems: Fresnel-RXI Köhler Concentrator," $3^{rd}$ International Workshop on CPV, Bremerhaven, Oct. 2010.

International Search Report for PCT/US2009/061950, dated Jun. 1, 2010.

Lynden-Bell, D. (2002) "Exact optics: a unification of optical telescope design," Mon. Not. R. Astron. Soc. 334:787-796.

Smestad, et al., "The thermodynamic limits of light concentrators", Solar Energy Materials, 21: 99-111, (1990).

Willstrop, R.V. et al. (2002) "Exact optics—II. Exploration of designs on- and off-axis," Mon. Not. R. Astron. Soc. 342:33-49.

Winston, R. et al. (2005) Nonimaging Optics, Academic Press (Elsevier).

* cited by examiner

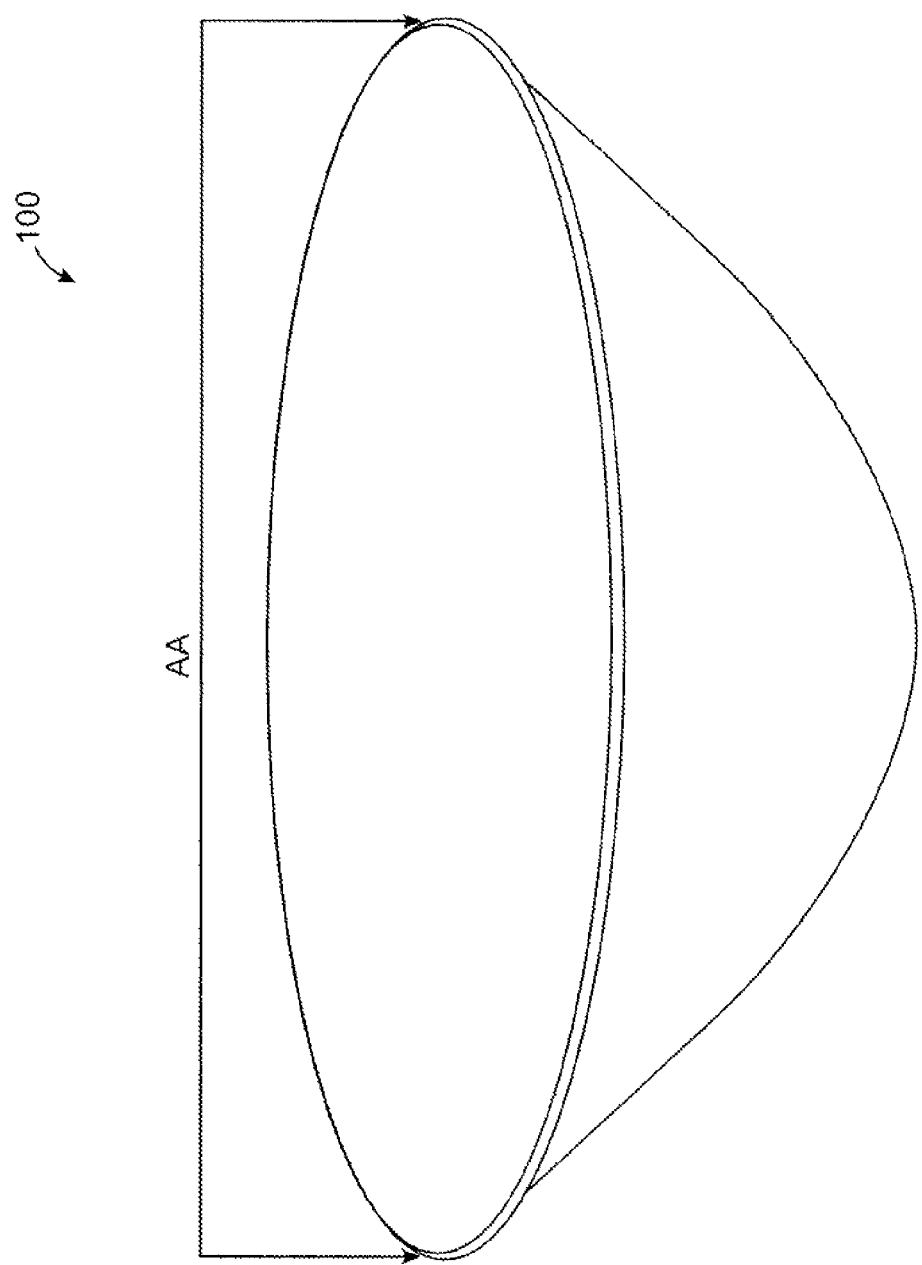

Exemplary Parameters

Geometrical concentration: 1,200 x
Optical efficiency:
        87% (no cover glass)
        79% (with cover glass)
Reflectivity of back mirror: 95%
Central obscuration: 3%
Acceptance angle (@90%): +/- 2°
Maximal incidence angle on cell: 60°
Photovoltaic Cell size: Ø 1 mm
Concentrator thickness: 10 mm
Concentrator diameter: 34 mm

FIG. 4

Acceptance Angle vs. Concentration

| $\theta_{in}$ [°] | C (design) | C (theor.) |
|---|---|---|
| 1 | 4,100 | 5,700 |
| 1.5 | 2,048 | 2,540 |
| 2 | 1,200 | 1,428 |
| 2.5 | 770 | 913 |

Material: Glass (n=1.52)

FIG. 7

LIGHT CONCENTRATION APPARATUS, SYSTEMS AND METHODS

CROSS-REFERENCE TO RELATED APPLICATIONS

The present application is a national stage application under 35 U.S.C. §371 of International Application No. PCT/US2009/061950, filed Oct. 23, 2009, which in turn claims the benefit under 35 U.S.C. §119(e) to U.S. Provisional Ser. No. 61/108,696, filed Oct. 27, 2008, contents of each of which are hereby incorporated by reference into the present disclosure.

BACKGROUND OF THE INVENTION

This disclosure relates to the concentration of light, and, more particularly, the concentration of light using an optical element.

Typically, light concentrators operate to receive light incident over a range of angles less than an acceptance angle at an aperture. The light is concentrated onto a region (e.g., on an absorber) with an area smaller than the area of the aperture. The ratio of the aperture area to the smaller area is known as the geometric concentration C. The laws of thermodynamics set a theoretical upper bound, known in the art as the "thermodynamic limit," to the concentration for a given concentrator configuration.

Many types of solar concentrators have been studied including reflective and refractive devices. Concentrators may be imaging or non imaging, and may be designed to correct for various types of optical aberration (spherical aberration, coma, astigmatism, chromatic aberration, etc.). For example, D. Lyndon-Bell, Monthly Notices of the Royal astronomical Society, vol. 334, pp. 787-796 (2002), describes an aplanatic concentrator featuring primary and secondary reflectors. However, the efficiency of such concentrators is limited by the obscuration of the primary reflector by the secondary reflector.

Optical concentrators may be applied, for example, in the conversion of solar energy to electricity (or other form of energy). The power that a photovoltaic solar cell can produce is a function of the incident sunlight. A typical solar cell can utilize efficiently many times the un-concentrated incident sunlight in typical settings, provided that the temperature of the solar cell does not increase excessively. Therefore, an optical concentrator can be employed to concentrate sunlight onto a photovoltaic cell to improve the output of the photovoltaic cell. The output will increase with the concentration factor. At appreciable concentration factors, cooling may be required, since the efficiency of some photovoltaic cells may decrease rapidly with increasing temperatures.

Optical concentrators may be applied in a variety of other applications including, for example, imaging, photography, concentration of light from sources such as lasers or light emitting diodes (LEDs), etc.

SUMMARY OF THE INVENTION

The inventors have realized that a multiple surface optical concentrator may be used to concentrate light. At least one of the surfaces includes a one-way light admitting portion which selectively admits light through the surface into the concentrator while reflecting (e.g., via total internal reflection) light impinging on the surface from within the concentrator. Such a concentrator may provide excellent concentration while reducing or avoiding obscuration of further surfaces by the surface which includes the one-way light admitting portion.

In some embodiments, the concentrator may be an imaging aplanatic concentrator (i.e., substantially free of spherical and comatic aberration. Such concentrators may be used in numerous applications including the collection of solar energy.

The inventors have also realized that an imaging aplanatic multiple surface optical concentrator of the type described herein may be designed using a flexible, convenient, and computationally straightforward iterative method. Any number of techniques may then be used to manufacture the concentrator based on the design.

In one aspect, an apparatus for concentrating light from a source is disclosed including: a front surface including a one-way light admitting portion; a back surface including a reflecting portion; and an internal region disposed between the front surface and back surface. The one-way light admitting portion admits at least a portion of light incident from the source from outside of the internal region into the internal region and onto the reflecting portion of the back surface. The reflecting portion of the back surface reflects the portion of light back through the internal region towards the front surface facing the internal region. The front surface includes a side facing the internal region which reflects light incident from the back surface and concentrates the light to a concentration region. At least a portion of the reflected and concentrated light is reflected from the one-way light admitting portion of the front surface.

In some embodiments, the internal region includes a refractive material. In some embodiments, the refractive material includes dielectric material.

In some embodiments, the one-way light admitting portion includes an interface between the refractive material in the internal region and a material outside the internal region having a differing index of refraction, and where the portion of light reflected from the one-way light admitting portion is reflected due to total internal reflection.

In some embodiments, the material outside the internal region having a differing index of refraction has an index of refraction which is less that the index of refraction of the refractive material in the internal region. In some embodiments, the material outside the internal region includes a fluid having an index of refraction of about n=1.

In some embodiments, the refractive material in the internal region includes a fluid.

In some embodiments, the refractive material includes a material selected from the list consisting of: water, oil, mineral oil. Some embodiments, further include a shell surrounding the internal region, the shell may include the front and back surfaces. Some embodiments include a circulator for circulating the fluid through the internal region. The circulator may adapted to remove heat from the internal region. Some embodiments include an absorber locate proximal to the concentration region, and the circulator may be adapted to remove heat from the absorber. In some embodiments, the circulator includes a heat exchanger in thermal communication with the fluid and configured to remove heat from the fluid. Some embodiments include a heat converter which converts heat from the fluid to another form of energy.

In some embodiments, material outside the internal region includes a fluid, e.g., water, oil, and/or mineral oil. Some embodiments include a circulator for circulating the fluid outside the internal region. The circulator may be adapted to remove heat from the internal region. In some embodiments, the circulator includes a heat exchanger in thermal communication with the fluid and configured to remove heat from the fluid.

In some embodiments, the front surface, back surface, and internal region are adapted to form an image of the source at the concentration region. In some embodiments, the front surface and back surface are aspherical surfaces adapted to substantially eliminate spherical and comatic aberration of the image of the source. In some embodiments, light rays forming the image of the source substantially satisfy the Abbe sine condition.

In some embodiments, the reflecting portion of the back surface includes a metalized surface portion.

In some embodiments, the front surface includes a centrally located reflector including a reflective side facing towards the internal region and a light blocking side facing away from the internal region. The one-way light admitting portion of the front surface may substantially surround the centrally located reflector. In some embodiments, the centrally located reflector provides a central obscuration of less than about 10%, 7%, 3%, or less.

In some embodiments, light from the source incident on the front surface at an angle of incidence less than about 2 degrees is concentrated to the concentration region with an efficiency of greater than 70%, 80%, 90% or more.

In some embodiments, light from the source incident on the front surface at an angle of incidence less than about 2 degrees is concentrated to the concentration region with an geometrical concentration ratio of about 500 or greater, 1,000 or greater, 1,200 or greater, 2000 or greater.

In some embodiments, light from the source incident on the front surface at an angle of incidence less than about 1.5 degrees is concentrated to the concentration region with an geometrical concentration ratio of about 500 or greater, or 1,000 or greater In some embodiments, light from the source incident on the front surface at an angle of incidence less than about 1 degrees is concentrated to the concentration region with an geometrical concentration ratio of about 500 or greater, 1,000 or greater, 2,000 or greater, 3,000 or greater, or 4,000 or greater.

In some embodiments, the source is imaged at an image plane in the concentration region, and where the light forming the image of the source is incident on the image plane at angles less than about 60 degrees.

In some embodiments, light from the source incident on the front surface at an angle of incidence less than about 2 degrees is concentrated to the concentration region at about the thermodynamic limit.

In some embodiments, the dielectric material includes at least one chosen from the group consisting of: glass, plastic, quartz, and transparent fluid.

In some embodiments, the dielectric material has an index of refraction greater than about 1.3.

Some embodiments further include the source. In some embodiments, the source includes at least one chosen from the group consisting of: a light emitting diode; a laser; a lamp.

In another aspect, a system is disclosed including: an optical concentrator of the type described herein; and a light receiving element located proximal to the concentration region. The optical concentrator is adapted to concentrate light from the source onto the energy absorbing element.

In some embodiments, the light receiving element includes an energy converting element adapted to absorb light concentrated at the concentration region and output energy in response to the absorbed light.

In some embodiments, the energy converting element outputs electrical energy in response to the concentrated light.

In some embodiments, the light receiving element includes a photovoltaic cell.

In some embodiments, the energy converting element produces thermal energy in response to the concentrated light.

In some embodiments, the light receiving element includes a photodiode, a laser gain medium, a photographic medium, or a digital imaging sensor. In some embodiments, the digital imaging sensor is included of at least one selected from the group consisting of: a CCD, a multi-pixel array of photodetectors, a CMOS detector. In some embodiments, the light receiving element includes a digital light processor or a MEMs device.

In another aspect, an optical imaging system is disclosed including a plurality of optical elements adapted to image light from an image plane onto an object plane, the plurality of lenses including the optical concentrator of the type described herein. In some embodiments, the plurality of optical elements include a telephoto lens system.

In another aspect, a method is disclosed for designing an imaging, aplanatic optical concentrator including a front surface with a one-way light admitting portion, a back surface with a reflective portion, and an interior region of refractive material disposed therebetween, the method including: determining the shape of the front and back surfaces by: defining an Abbe sphere with radius b; defining an initial ray parallel to an optical axis of the concentrator which is incident upon the front surface at an initial front surface point located on the Abbe sphere; selecting a position along the optical axis for an initial back surface point; determining the surface tangent slope at each of the initial front surface point and the initial back surface point by requiring that light from the initial ray refracts at the initial front surface point, propagates along a propagation path through the interior region to the initial back surface point, reflects from the initial back surface point, propagates back along the same propagation path to the initial front surface point, reflects from the initial front surface point due to total internal reflection, and propagates to the center of the Abbe sphere. The method further includes iteratively determining the position and tangent slopes at additional front and back surfaces points based on the positions of and surface tangent slopes at the initial front and back surface points.

In some embodiments, determining the shape of the front and back surfaces includes: determining cross sectional shapes of the front and back surfaces; and defining the shape of the front and back surfaces as the rotation of the cross sectional shapes about the optical axis.

In some embodiments, the method includes defining a coordinate system with orthogonal axes Y and Z and intersecting at point P, where Z corresponds to an optical axis of the concentrator; defining an Abbe sphere with radius b centered at P; defining a series of N light rays Ray #i, where i=0, 1, 2, . . . N−1, the rays traveling parallel to the Z axis to intersect the front surface of the concentrator, and where $A_i$ is a point where parallel Ray #i intersects the Abbe sphere; $R_i$ is a point where parallel Ray #i intersects front surface and refracts; $B_i$: is a point where Ray #i intersects rear surface and reflects; $X_i$: the point where Ray #i intersects front surface the second time and reflects; $kB_i$: the slope of the surface tangent at $B_i$; and $kX_i$: the slope of the surface tangent at $X_i$. The method includes selecting an angle $\theta$; requiring that the (Y,Z) coordinates of $R_0$ be (b cos($\theta$), b sin($\theta$)) such that $R_0$ lies in the Abbe sphere and $A_0$ and $X_0$ coincide with $R_0$; selecting the Z coordinate of $B_0$; determining $kX_0$ based on the relation $kX_0 = \tan(\alpha) = (((n_0/n_1) + \cos(\theta))/\sin(\theta))$, where $n_0$ is the index of refraction of a media surrounding the concentrator and $n_1$ is the index of refraction of the refractive material; determining $kB_0$ based on the relation $kB_0 = (c \tan(2\alpha) c \tan(\theta) - 1)/(c \tan(\theta) + c \tan(2\alpha))$; constructing the front and back surfaces by iteratively determining $X_i$ and $B_i$ for i=1, 2, ..., N−1. The iteratively determining includes the steps of: determining $X_{i+1}$ by extending the front surface along $kX_i$ direction for a small step; determining $A_{i+1}$ as the intersection of the line from point P to point $X_{i+1}$ with the Abbe sphere; determining $R_{i+1}$ as the intersection of Ray #(i+1) passing through the Abbe sphere at $A_{i+1}$ with the front surface; determining the path of propagation of light from Ray #(i+1) from point $R_{i+1}$ through the interior region to the back surface; determining $B_{i+1}$ by intersecting the path of propagation of light from Ray #(i+1) from point $R_{i+1}$ with a line extending along the $kB_n$ direction; determining $kB_{n+1}$ such that the ray of light from $R_{i+1}$ to $B_{i+1}$ reflects at $B_{i+1}$ back towards $X_{n+1}$; determining $kX_{i+1}$ such that the ray of light from $B_{i+1}$ to $X_{i+1}$ reflects at $X_{i+1}$ towards P.

Some embodiments include, for each point on the front surface, providing reflective material on the side of the front surface facing the interior region if the ray of light reflected from the back surface through the interior region onto the point does not meet the condition for total internal reflection.

In another aspect, an optical concentrator is disclosed including: an imaging, aplanatic optical element including a front surface with a one-way light admitting portion, a back surface with a reflective portion, and an internal region of refractive material disposed between the front and backs surfaces. In some embodiments, the one way light admitting portion selectively admits light incident from outside the internal region while reflecting light incident from the internal region. In some embodiments, the one way light admitting portion reflects light incident from the internal region by total internal reflection.

In some embodiments, the optical element has an acceptance angle of about 2 degrees or greater. In some embodiments, the optical element concentrates light incident at less than the acceptance angle with a concentration ratio of about 1000 or greater. In some embodiments, the optical element concentrates light incident at less than the acceptance angle with an efficiency of about 70% or greater. In some embodiments, the optical element concentrates light at about the thermodynamic limit.

In some embodiments, the internal region includes a refractive fluid. Some embodiments include a circulator configured to circulate the refractive fluid. In some embodiments, the optical element includes a shell defining the internal region, the shell including the front and back surfaces.

In another aspect, a method of concentrating light from a source is disclosed including: providing a concentrator of the type disclosed herein; directing light from the source to the concentrator; and using the concentrator, concentrating light in the concentration region. Some embodiments include providing an absorber at the concentration region; and using the absorber, absorbing optical energy from the source. Some embodiments include converting absorbed optical energy into another form of energy.

Various embodiments may include any of the above described features, either alone, or in combination.

BRIEF DESCRIPTION OF THE DRAWINGS

The accompanying drawings, are not intended to be drawn to scale. In the drawings, each identical or nearly identical component that is illustrated in various figures is represented by a like numeral. For purposes of clarity, not every component may be labeled in every drawing. FIG. 1A shows a perspective view of a concentrator.

FIG. 4 shows exemplary parameters for the concentrator of FIG. 1A.

FIG. 7 shows exemplary performance parameters for concentrators having various design parameters.

DETAILED DESCRIPTION OF THE PREFERRED EMBODIMENTS

Figure 1B:
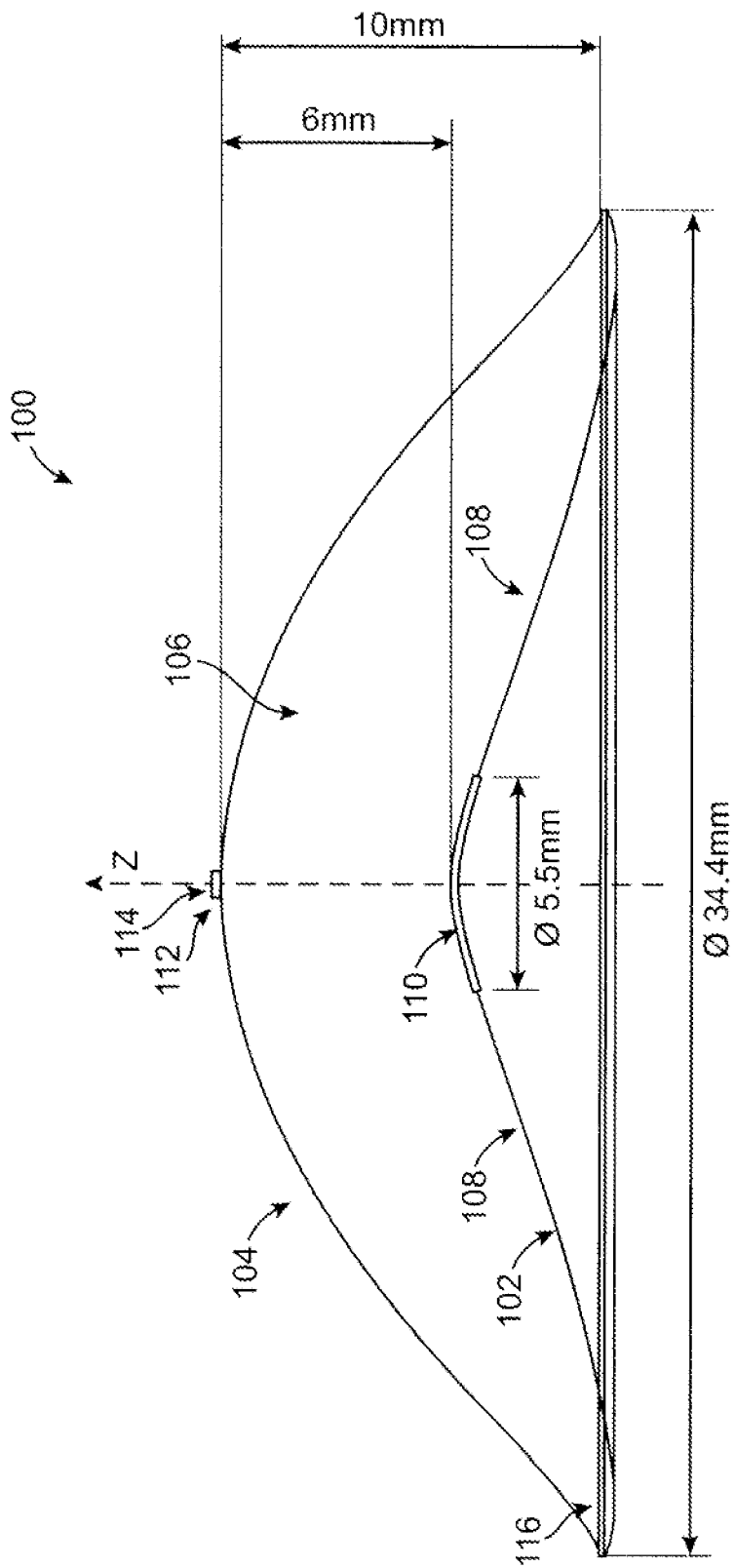
FIG. 1B shows a cross section of the concentrator of FIG. 1A.

FIG. 1A shows a perspective view of concentrator 100. FIG. 1B shows a cross section of concentrator 100 taken along diameter AA. Concentrator 100 includes front surface 102 and back surface 104 positioned along optical axis Z. Surfaces 102 and 104 define an internal region 106 containing a refractive material with index of refraction n.

Front surface 102 includes one way light admitting portion 108, described in greater detail below. Front surface 102 may optionally include central reflector portion 110. Central reflector portion 110 is opaque to light impinging from outside of internal region 106 and reflective to light impinging from within internal region 106. For example, central reflector portion 110 may be a metalized mirror coating on front surface 102.

Back surface 104 is reflective (e.g., having a metalized mirror coating). Light passing through front surface 102 and internal region 106 onto back surface 104 is reflected back towards front surface 102.

Concentrator 100 operates to concentrate light incident on front surface 102 to concentration region 112 located along optical axis Z at or near back surface 104. An absorber 114 (e.g., a photovoltaic cell) may optionally be positioned at or near concentration region 114 to absorb concentrated light. Concentrator 100 may optionally include cover glass 116.

FIG. 1B shows a number of suitable exemplary dimensions for concentrator 100. As shown, concentrator 100 has an outer diameter of 34.4 mm. The minimum distance between front surface 102 and back surface 104 along optical axis Z is 6 mm while the maximum distance between the surfaces is 10 mm. Central reflecting portion 110 extends 5.5 mm radially from optical axis Z. It is to be understood that the above dimensions are exemplary in nature, and that any suitable dimensions may be used.

Figure 2:
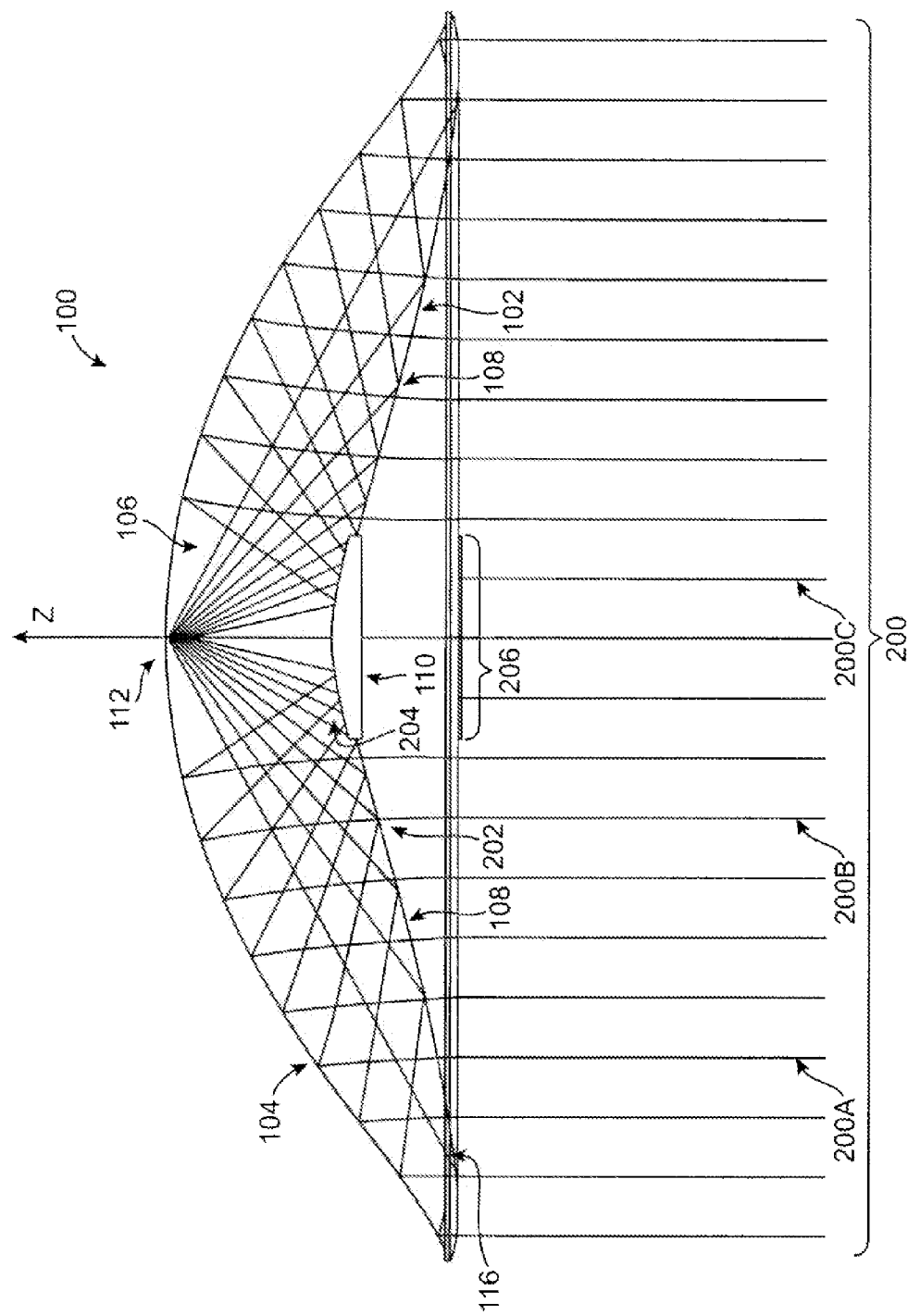
FIG. 2 is a ray trace diagram of the concentrator of FIG. 1A.

FIG. 2 is a ray trace diagram of concentrator 100 showing the propagation of parallel rays 200 through the concentrator. A first group of rays 200 propagate through collector 100 and are reflected from the interior side of front surface 102 by total internal reflection (TIR) from one-way light admitting portion 108. For example, ray 200A is incident on front surface 102 at a point within one-way light admitting portion 108. One-way light admitting portion 108 is transparent to light incident from outside of internal region 106. Accordingly, ray 200A passes through front surface 102. At front surface 102, ray 200A is refracted by the refractive material within internal region 106 and directed towards a point on back surface 104. Ray 200A is reflected from back surface 104 towards front surface 102 and towards optical axis Z. Ray 200A impinges point 202 on the interior side of front surface 102. The shapes of surfaces 102 and the refractive properties of the material in internal region 106 are chosen to ensure that ray 200A meets the condition for TIR at point 202. Accordingly, ray 200A reflects from point 200 and is directed back towards concentration region 112 located at or near back surface 104 near optical axis Z.

A second group of rays 200 propagate through collector 100 and are reflected from the interior side of front surface 102 by reflector portion 110 instead of by TIR from one-way light admitting portion 108. For example, ray 200B is incident on front surface 102 at a point within one-way light admitting portion 108. Ray 200b passes through front surface 102, is refracted by the refractive material within internal region 106 and directed towards a point on back surface 104. Ray 200B is reflected from back surface 104 towards front surface 102 and towards optical axis Z. Ray 200A impinges point 204 on the interior side of front surface 102 within central reflector portion 110. Central reflector portion 110 includes a reflective surface (e.g., a metalized mirror surface) on the interior side of front surface 102 which reflects ray 200B back towards concentration region 112 located at or near back surface 104 near optical axis Z.

A third group of rays, for example ray 200C, are incident on front surface 102 within central reflector portion 110. Such rays are blocked central reflector portion 110, creating central obscuration 206. Note however, that central obscuration 206 is small compared to the remainder of front surface 102, such that the vast majority of light incident on surface 102 passes into the concentrator to be concentrated to region 112. For example, in some embodiments the central obscuration may be about 3% or less.

As shown, concentrator 100 provides aplanatic imaging. Concentrator 100 forms an image of a light source at region 112 which is free from comatic aberration. In other words, concentrator 100 obeys the well known Abbe sine condition. For example, for a source located at "infinity", the sine condition requires that each ray incident from the source in the direction parallel to the optical axis of the concentrator intersects its conjugate ray on a sphere having a radius equal to the focal length of the concentrator and centered at the focal point (referred to as the "Abbe sphere").

Figure 3A:
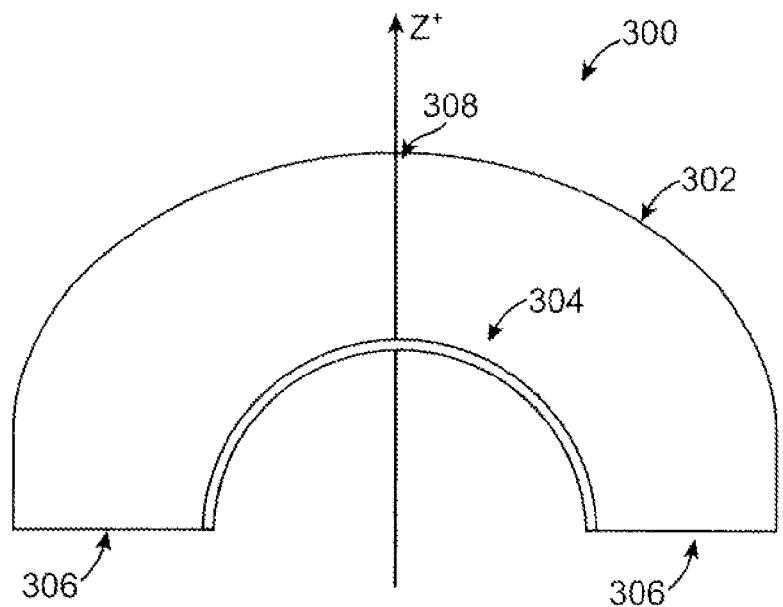
FIG. 3A shows a two reflector concentrator of the type known in the art.

FIG. 3A shows a prior art two surface imaging aplanatic concentrator 300 of the type described in D. Lyndon-Bell, Monthly Notices of the royal astronomical society, vol. 334, pp. 787-796 (2002). Concentrator 300 includes primary reflector and secondary reflector 304. Light incident on primary reflector 302 through opening 306 is reflected back onto secondary reflector 304 and concentrated at region 308. The concentration obtained by concentrator 300 tends to increase with an increase in size of secondary reflector 304. However, secondary reflector 304 acts to obscure primary reflector 302 (i.e., by reducing the size of opening 306). Thus, increasing the size of secondary reflector 304 results in an unavoidable trade off between (unwanted) central obscuration and (desired) concentration.

Figure 3B:
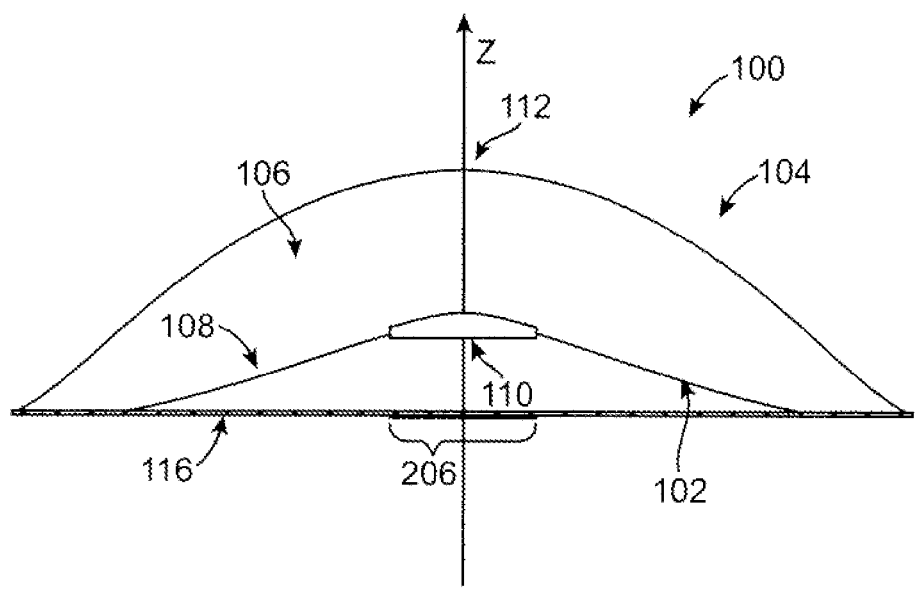
FIG. 3B shows a cross section of the concentrator of FIG. 1A.

Referring to FIG. 3B, concentrator 100 does not suffer from the above described trade off. Substantially all of the interior side of front surface 102 is available to reflect light incident from back surface 104 (either from central reflection portion 110 or one-way light admitting portion 108). However, as noted above, because one-way light admitting portion 108 is transparent to light impinging on the outer-facing side of front surface 102, collector 100 suffers only from a small central obscuration 206 caused by central reflector portion 110. Accordingly, collector 100 provides good performance and flexibility of design.

FIG. 4 shows exemplary parameters for a concentrator of the time shown in FIG. 1B with a concentrator diameter of about 34 mm, thickness of about 10 mm, and index of refraction n of about 1.52. Such concentrator may provide geometrical concentration C=1,200 or greater, near the thermodynamic limit. The optical efficiency may be 87% or greater with no cover glass, and 79% or greater with a cover glass. In this example, the reflectivity of back surface 102 is about 95%, and the central obscuration 206 about 3%.

Figure 5:
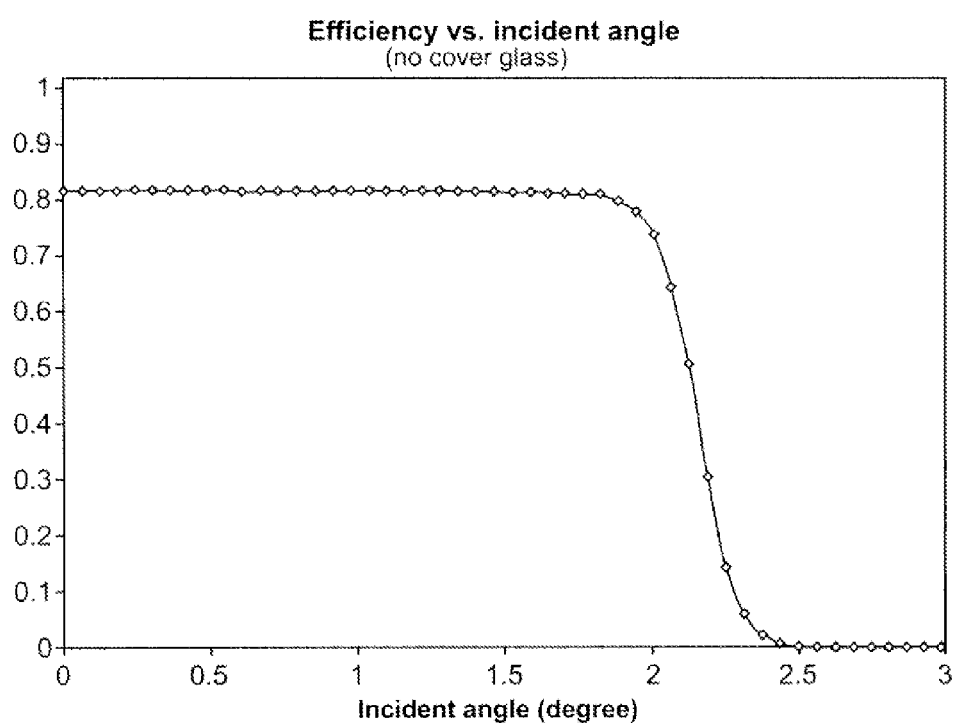
FIG. 5 shows a plot of efficiency vs. incident angle for a concentrator.

The acceptance angle of the concentrator may be +/−2 degrees or greater. For example, FIG. 5 shows an exemplary plot 500 of optical efficiency vs. incident angle for concentrator 100 with no cover glass. As shown, optical efficiency may be high and nearly constant for acceptance angles of +/−2 degrees or more.

Figure 6:
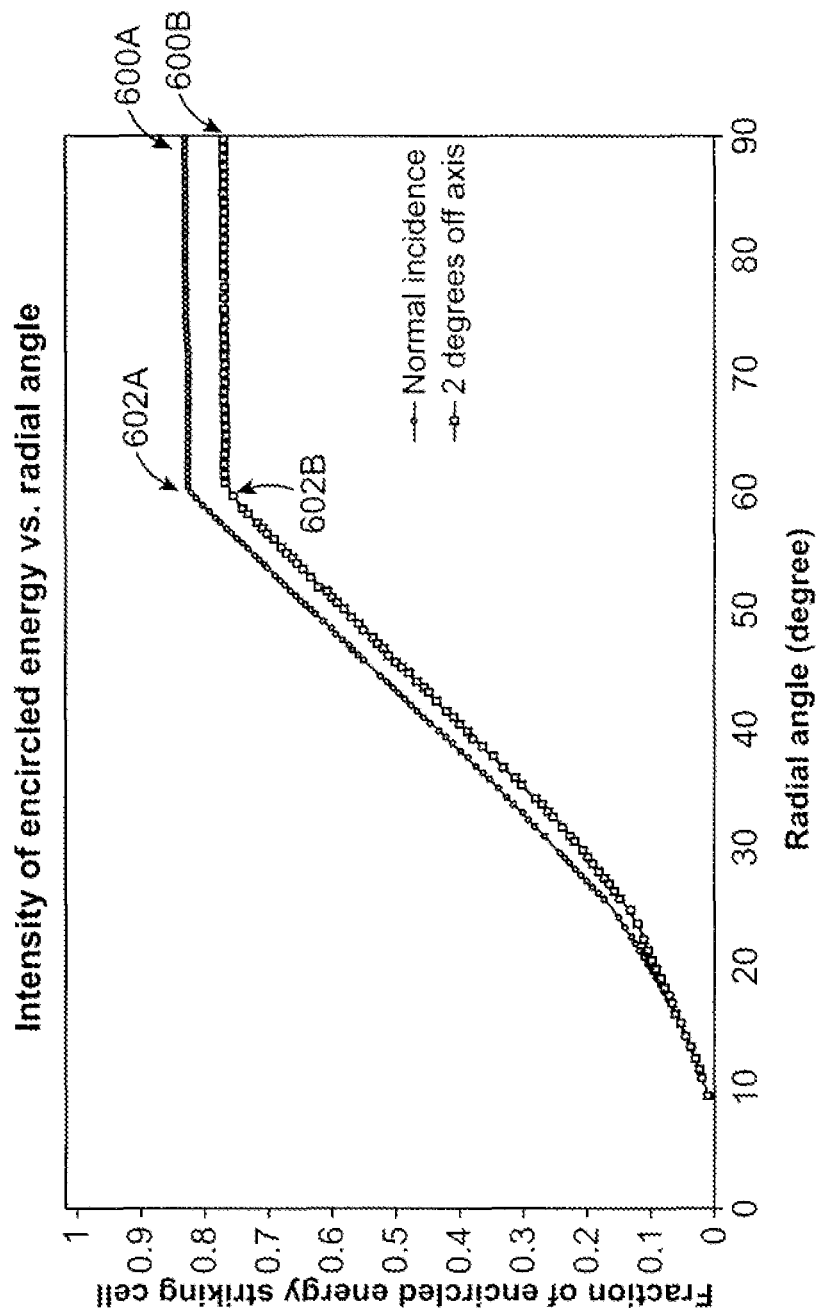
FIG. 6 shows plots of intensity vs. radial angle for a concentrator.

Still referring to the example of FIG. 4, absorber 114 was a photovoltaic cell with a radius of about 1 mm. In typical applications, such a cell can only effectively convert light incident at an angle less than a maximum cell acceptance angle. In the current example, concentrator 100 concentrates, substantially, light on the cell at angles of incidence less than about 60 degrees. For example, FIG. 6 shows exemplary plots 600A and 602B of the intensity of encircled energy incident on the cell vs. the radial angle (i.e., angle of incidence). Plot 600A refers to source light striking concentrator 100 at normal incidence while plot 600B refers to source light striking concentrator 100 at 2 degrees off axis. As indicated by the sharp inflection points 602A and 602B in plots 600A and 600B, substantially all of the light striking the cell may do so at angles less than 60 degrees.

Although specific exemplary parameters are given above, it is to be understood that other configurations may be used and even tailored to a particular application. For example, FIG. 7 shows exemplary performance characteristics are shown for a variety of possible configurations of concentrator 100, each having index of refraction n of about 1.52. For example, for a concentrator with an acceptance angle of about +/−1 degree, a geometrical concentration C up to about 2,500 or greater may be provided. For a concentrator with an acceptance angle of about +/−1.5 degrees, a geometrical concentration C up to about 4,000 or greater may be provided. For a concentrator with an acceptance angle of about +/−2 degrees, a geometrical concentration C up to about 1,200 or greater may be provided. For a concentrator with an acceptance angle of about +/−2.5 degrees, a geometrical concentration C up to about 770 or greater may be provided. Note, in each case the available concentration compares favorably with the theoretical maximum.

In various embodiments, concentrator 100 may be constructed of any suitable materials. For example, concentrator 100 may be formed from refractive material such as glass, plastic, quartz, etc. The material may include any suitable type of material including dielectrics, semiconductors, non linear optical (NLO) materials, active gain media, graded index of refraction (GRIN) materials, photonic crystals, nano-structured materials, etc.

Figure 8:
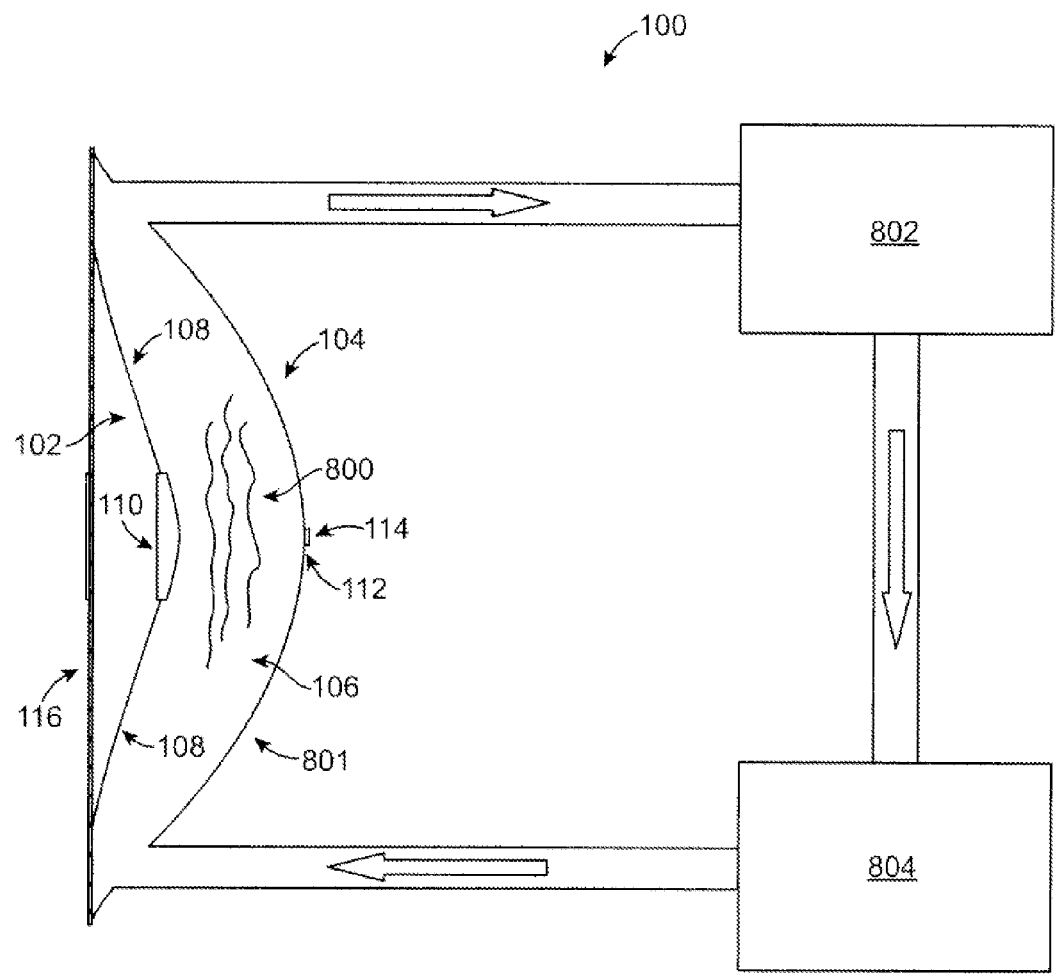
FIG. 8 shows a concentrator featuring a fluid filled internal region and circulation system.

Referring to FIG. 8, in some embodiments, concentrator 100 may include a shell 801 formed from surfaces 102 and 104. Internal region 106 is at least partially filled with a refractive fluid 800 (indicated with wavy lines). The fluid may be, for example, a liquid (e.g., water or mineral oil), gas, gel, or a mixture thereof. Shell 801 may be formed of any suitable material, e.g., plastic, glass, quarts, etc. In some embodiments, the fluid 800 may have an index of refraction which is substantially the same as that of shell 801. In other embodiments, the indices of refraction may differ.

Fluid 800 may be circulated (as indicated by broad arrows) through internal region 106 using pump 802. This circulation may operate to remove unwanted heat generated by the concentration of light onto absorber 114. Fluid 800 may also flow through heat exchanger 804 for cooling. In various embodiments, heat exchanger 804 may convert heat energy from fluid 800 into other forms of energy, e.g., electricity, using any suitable technique. Pump 802 and heat exchanger 804 may communicate with one or more sensors (not shown) either internal to or external from concentrator 100 in order to maintain the temperature of the concentrator within an acceptable temperature range (e.g., the preferred operating range of absorber 114). Note that although a closed circulation system is shown, other suitable types of fluid flow systems may be used.

In some embodiments, concentrator 100 may be situated in an external fluid medium. This medium may be circulated using techniques similar to those described above to remove heat from concentrator 100 or parts thereof. In various embodiments, this heat may be converted to other types of energy using any suitable technique.

Figure 9:
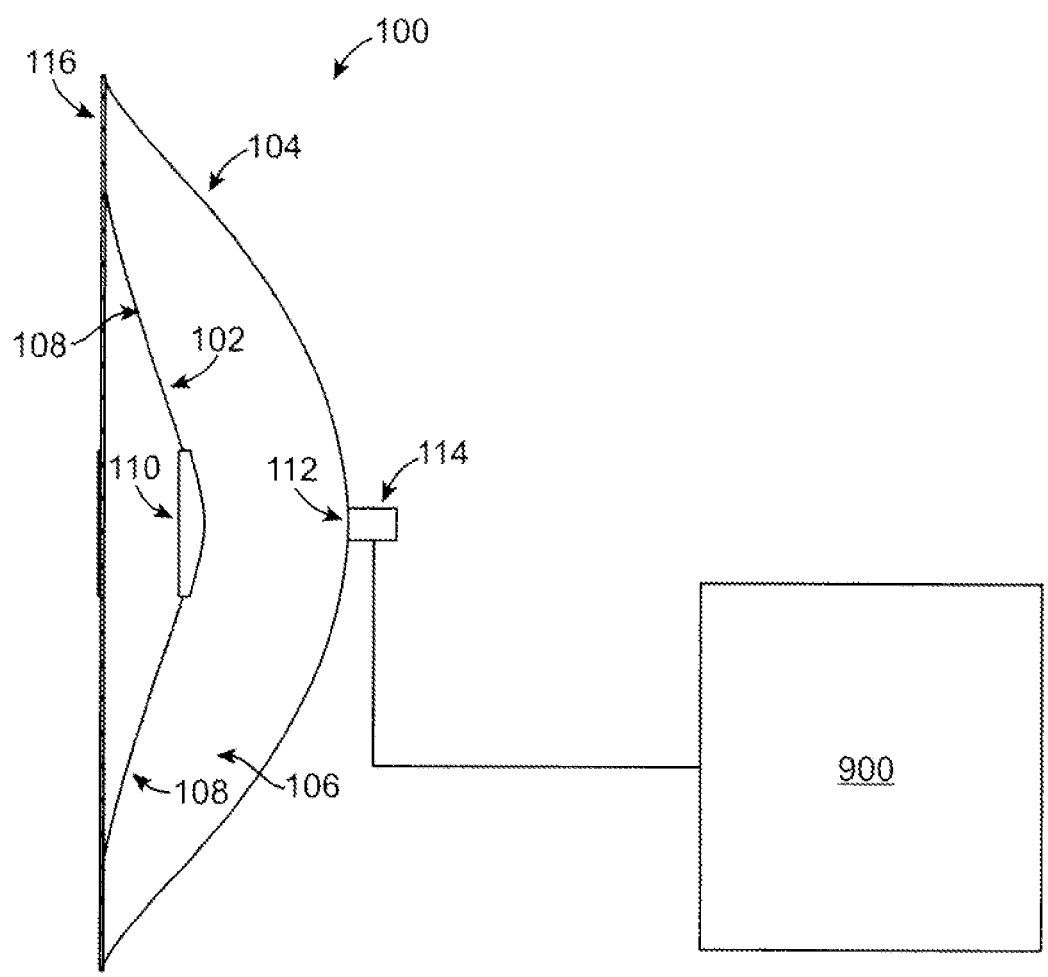
FIG. 9 shows a system featuring a concentrator with an absorber.

Referring to FIG. 9, concentrator 100 concentrates light from a source (not shown) onto absorber 114. Absorber 114 converts energy from the incident light into another form, and transmits this energy to module 900. Module 900 may, e.g., store the energy, use the energy to perform a function, further convert the energy, and/or transmit the energy to another location. For example, as noted above, absorber 114 may be a photovoltaic cell which converts solar energy to electrical energy (i.e., by producing a current or voltage). However, absorber 114 may take any suitable form including, for example: a photo cell, a photodetector, photodiode, a charge coupled device, a multi-pixel array of photodetectors, a CMOS detector, a scintillator, a digital camera, a digital light projector, a recording media such as photographic film, a photo-sensitive chemical, a thermocouple, a heatable thermal mass, a MEMs device, a laser gain media, etc.

Note that although FIG. 9 graphically represents the link between absorber 114 and module 900 with a wire, and suitable link may be used. For example, energy may be transmitted wirelessly from absorber 114 to module 900 in the form of inductive coupling, a laser or other light beam, RF energy, microwave energy, etc. The link may be a direct physical link. For example, absorber 114 may convert light energy to heat to boil water and transmit energy to module 900 via a steam pipe system or similar techniques.

In some embodiments, the shape of the distribution of light concentrated by concentrator 100 may fail to match the shape of the operating surface of absorber 114. For example, absorber 114 may be a square shaped photocell while concentrator 100 may concentrate solar light a circular spot, leading to inefficiency in absorption/conversion of solar energy. To correct such mismatch, in some embodiment one or more optical elements may be used to adjust the distribution of concentrated light produced by concentrator 100 at absorber 114.

Figure 10:
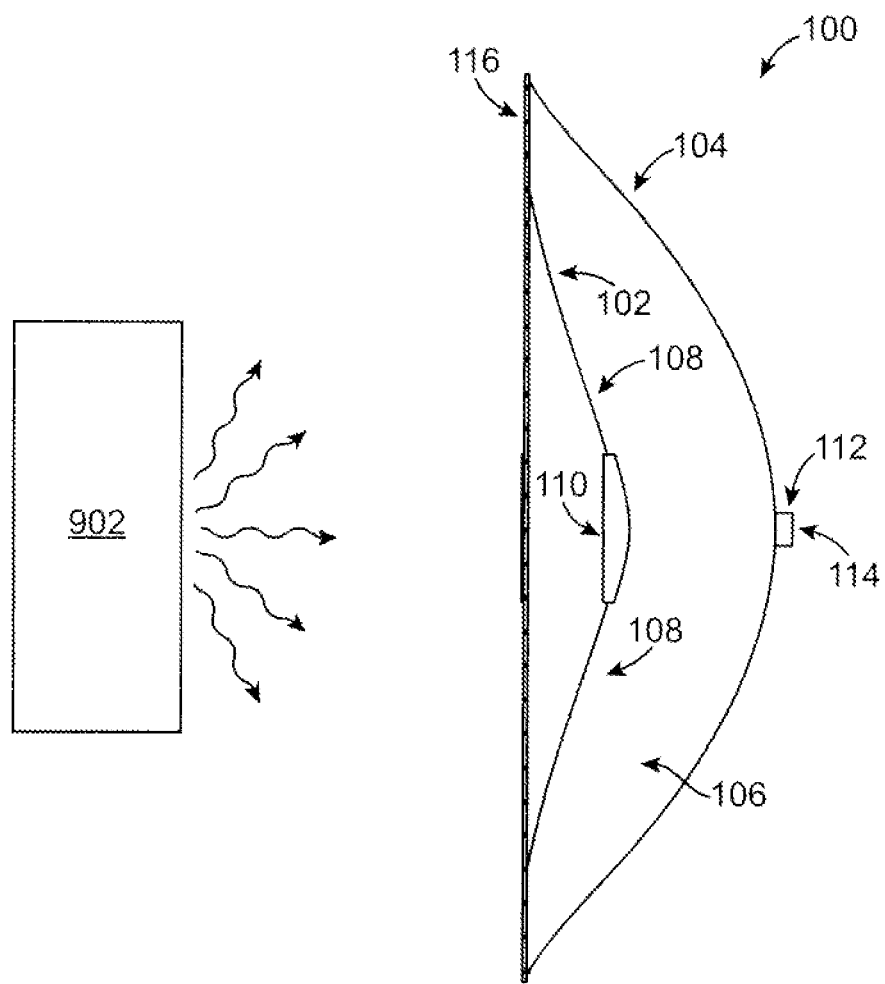
FIG. 10 shows a system featuring a light source and a concentrator.

Referring to FIG. 10, concentrator 100 concentrates light from source 902 to region 100 onto absorber 114 located on or near concentration region 112. For example, source 900 may be a light emitting diode and absorber 114 a diode pumped laser gain medium. In such a case, concentrator 100 may operate to concentrate light from the light emitting diode onto the gain medium to achieve efficient pumping of the laser. As will be understood by those skilled in the art, any of a variety of light sources may benefit from concentration of output light by concentrator 100. Such sources include: light emitting diodes, lasers (e.g., diode lasers), lamps (incandescent, fluorescent, etc.), fluorescent or phosphorescent materials, amplified stimulated emission sources, etc.

Figure 11:
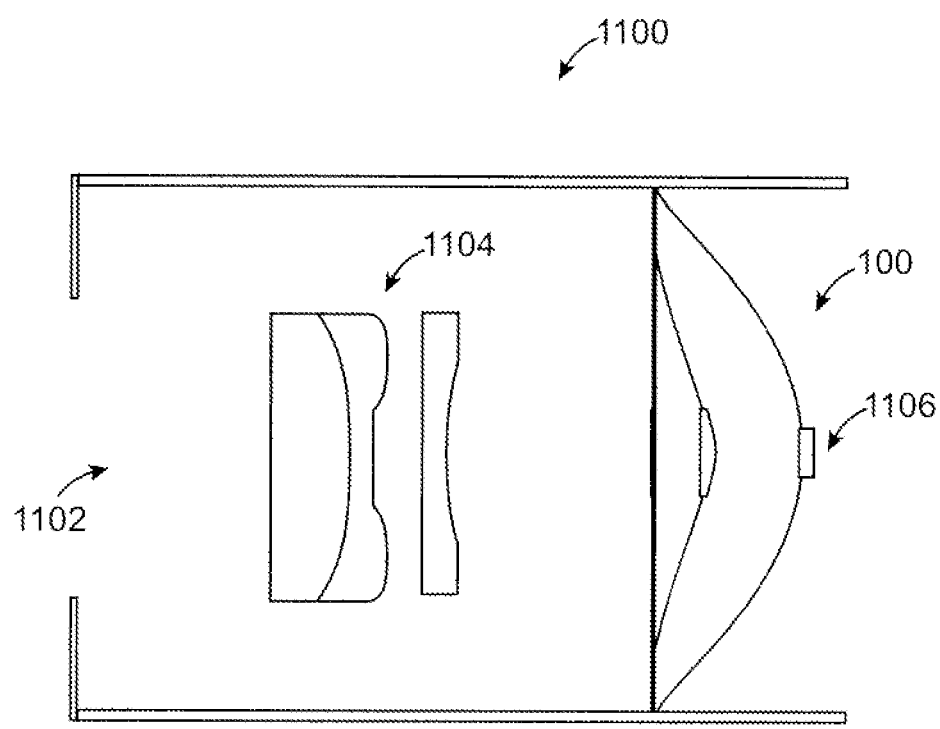
FIG. 11 shows an optical system featuring a concentrator.

In various embodiments, concentrator 100 may be included in an optical system with one or more other optical elements (refractive, reflective, or otherwise). For example, FIG. 11 shows a telephoto lens 1100 which includes an aperture 1102, telephoto lens group and concentrator 100 arranged along an optical axis. In various embodiments lens 1100 may include additional optical elements, aperture stops, and so forth (not shown). Concentrator 100 may operate to image and concentrate light from lens group 1104 onto photographic media 1106. Such concentration may provide for very fast exposure photographic media 1106. Concentrator 100 may similarly be employed in any number of other optical applications including, for example, microscopy, photolithography, telescopes (e.g., for astronomical observation, etc.)

Figure 12:
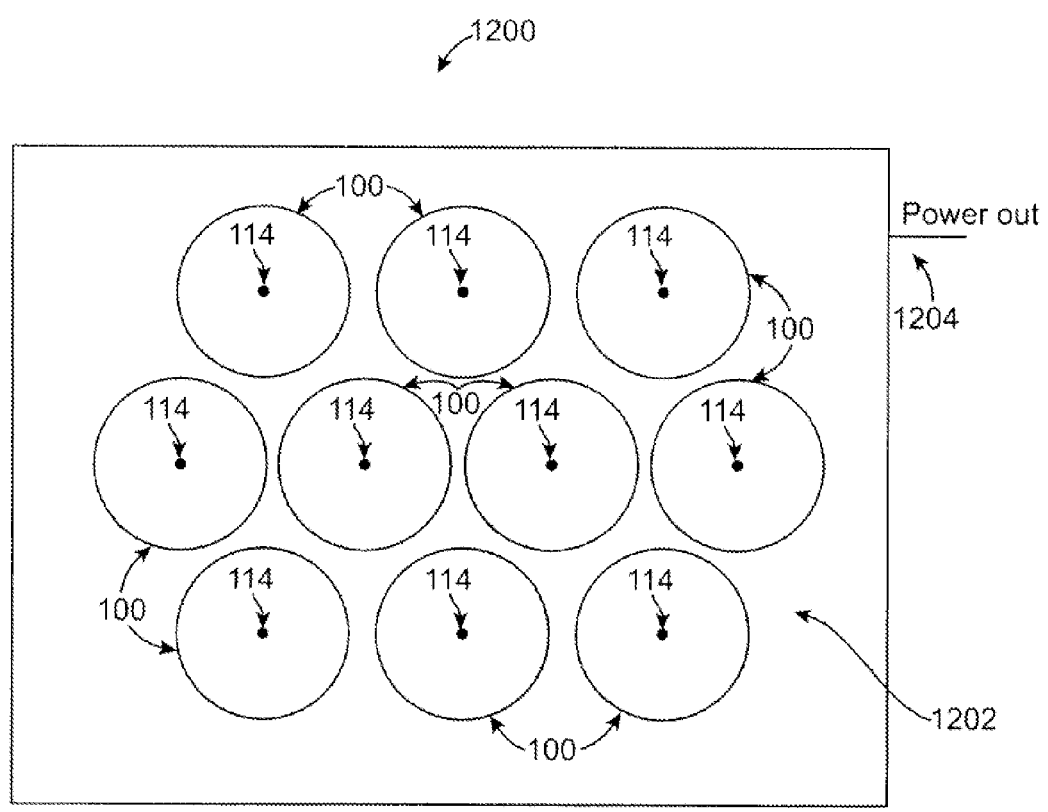
FIG. 12 shows a solar panel featuring a concentrator.

Referring to FIG. 12, in one embodiment, solar panel 1200 includes an array 1202 of concentrators 100 of the type described herein. Each concentrator 100 concentrates sunlight onto an absorber 114 (e.g., a photovoltaic cell or thermal cell) which in turn converts the concentrated solar energy into another form (e.g., electrical or thermal energy). Panel 1200 may include one or more connections between absorbers 114 for collecting the converted energy and directing it to output 1204. Note that although, as shown, panel 1200 features a flat regular, two dimensional array of collectors 100, in various embodiments other configurations may be used, including, for example one or three dimensional arrays, irregular patterns in any number of dimensions, curved arrays, etc.

Figure 13:
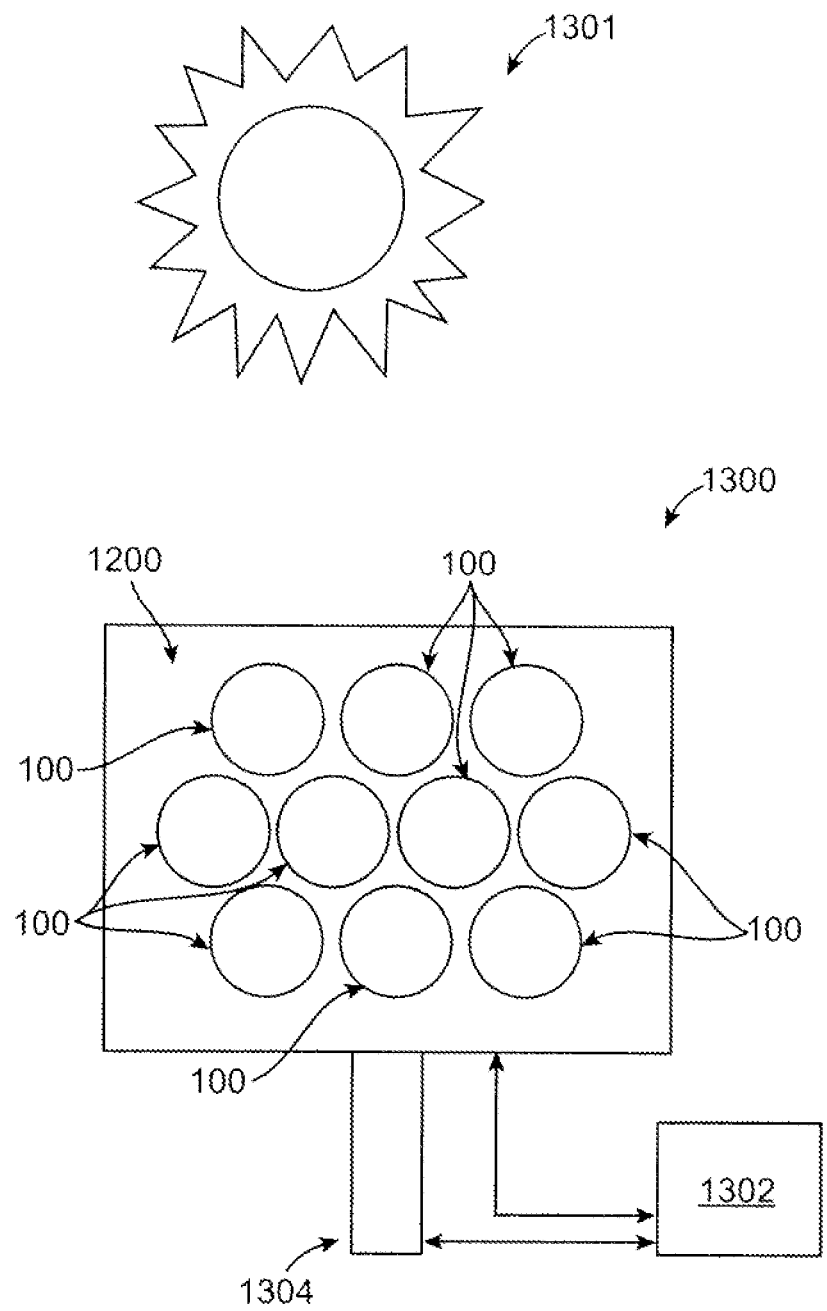
FIG. 13 shows solar energy collection system featuring a concentrator.

Referring to FIG. 13, in one embodiment, solar energy collector 1300 moves solar panel 1200 to track the movement of the sun 1301 across the sky in order to maximize the energy obtained (e.g., by maximizing the light incident on collectors 100 at angles less than the associated acceptance angle). Controller 1302 controls motorized mount 1304 to move panel 1200 along one or more degrees of freedom. Controller 1302 may monitor the output of panel 1200, thereby providing a feedback mechanism for positioning the panel. Of course it is to be understood that a similar collector system could be employed to track other (non-solar) light sources.

The above described devices and systems may be designed and manufactured using any suitable technique known in the art. The following describes exemplary convenient methods for concentrator design and construction.

In general, an imaging, aplanatic (i.e., substantially obeying the Abbe sine condition) may be easily designed using a "seed ray" approach. An Abbe sphere is defined for the concentrator along an optical axis. A seed ray parallel to the optical axis is defined which intersects the front surface of the concentrator on the Abbe sphere. The seed ray refracts from the front surface, propagate to the back surface, where it is required to retroreflector back along its path towards the front surface. The retroreflector ray strikes the front surface again at the same point on the Abbe sphere and is reflected by TIR (or another process) and directed towards the center of the Abbe sphere. Based on the above conditions, and on the index of refraction of the concentrator and the media in which it is situated, the positions and surface tangents of points on the front and back surfaces may be obtained. This information may then be utilized to iteratively determine the total shapes of the front and back surfaces.

Figure 14:
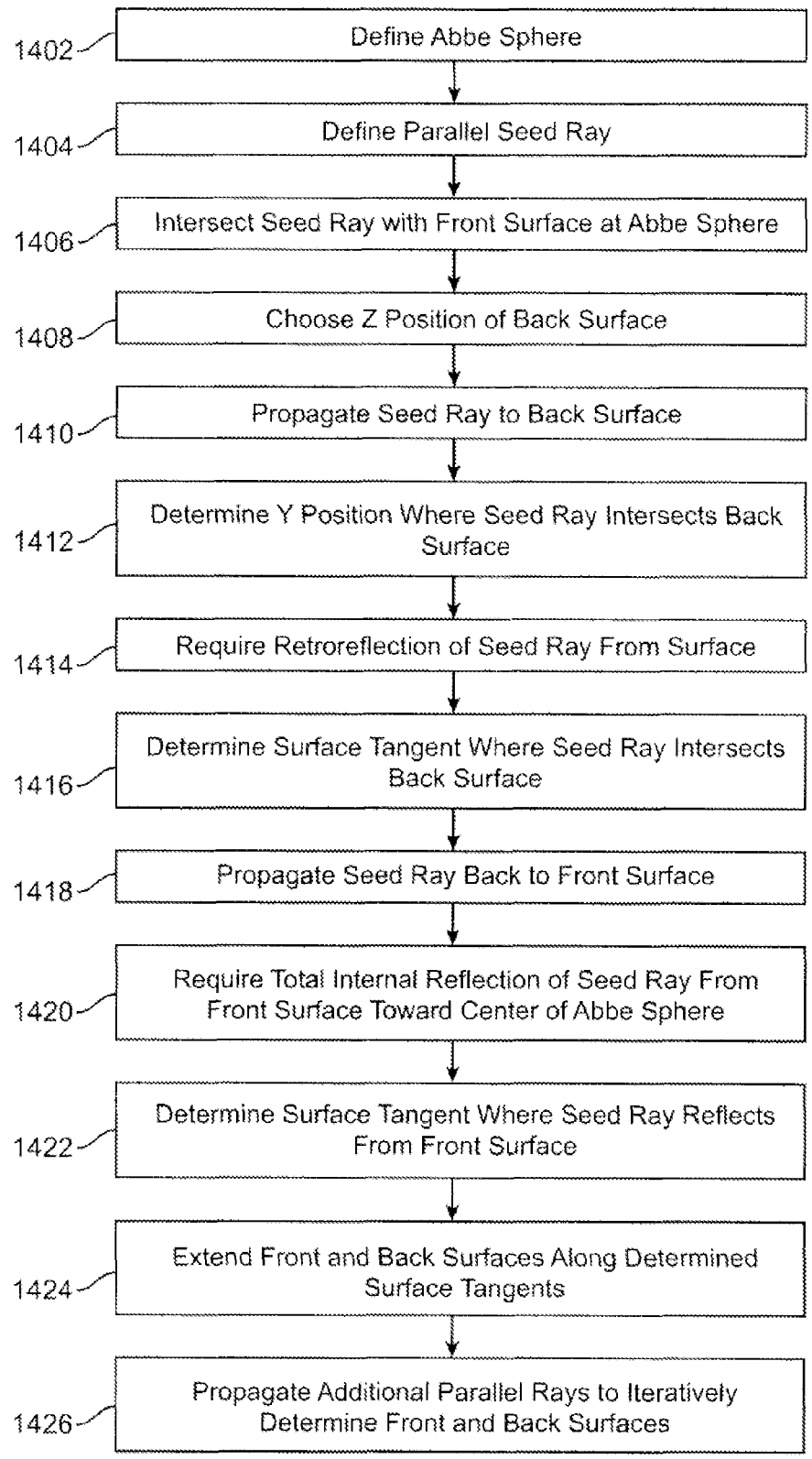
FIG. 14 is a flowchart illustrating steps for designing a concentrator.
Figure 15:
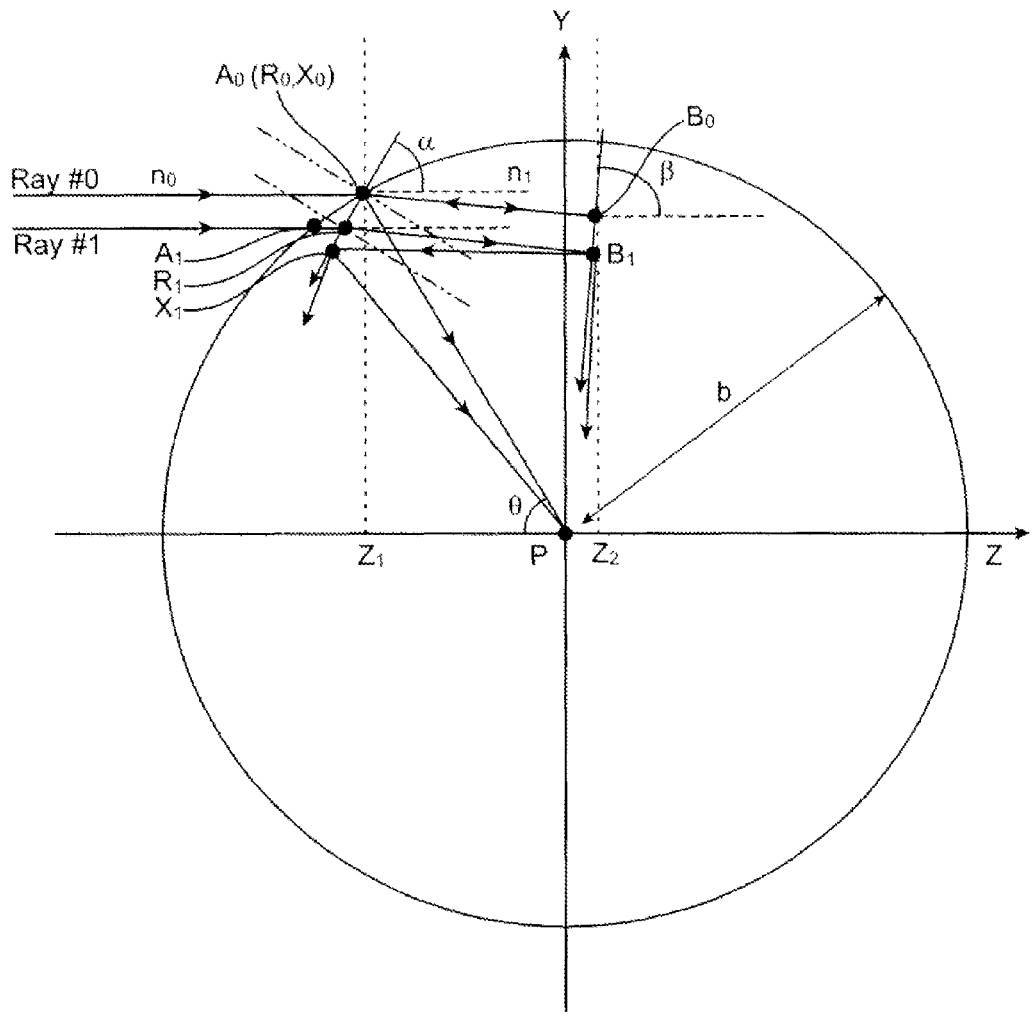
FIG. 15 is a graphical ray illustration of the steps of FIG. 14.

For example, Referring to FIG. 14, process 1400 may be used to determine the shapes of front and back surfaces 102 and 104 of an imaging, aplanatic embodiment of concentrator 100. In the interest of clarity, FIG. 15 provides an exemplary graphical representation of process 1400. Initially, assume that the concentrator lies along an optical axis Z, and is composed of a material with index of refraction $n_1$ and is situated in a medium (e.g., air) having index of refraction $n_0$. As explained in detail below, process 1400 traces a number of rays parallel to the optical axis and incident on concentrator 100 to iteratively determine the shapes of front surface 102 and back surface 104 of concentrator 100 (as they lie in a Y-Z plane arranged along a diameter of the concentrator). In the following discussion, define the variables below, where the index i runs over 0, 1, 2, 3 . . . , N. The upper limit N may be chosen based on design requirements (i.e., a larger N will provide a finer design surface output, but will make the iterative process more computationally expensive).

P: the center of an Abbe Sphere of radius b, also is the origin of the Y-Z coordinate system shown in FIG. 15;

$A_i$: the point where parallel Ray #i intersects the Abbe sphere;

$R_i$: the point where parallel Ray #i intersects front surface and refracts;

$B_i$: the point where Ray #i intersects rear surface and reflects;

$X_i$: the point where Ray #i intersects front surface 102 the second time and reflects (by TIR or mirror);

$kB_i$: the slope of the surface tangent at $B_i$;

$kX_i$: the slope of the surface tangent at $X_i$.

In step 1402 of process 1400, define an Abbe sphere of radius b equal to the focal length of the concentrator. The Abbe sphere is centered at the focal point of the concentrator. In step 1404 define a parallel "seed" ray (Ray #0).

In step 1406 intersect the seed Ray #0 with the front surface at point $A_0$ on the Abbe sphere. As shown in FIG. 15, this may be accomplished by choosing an angle θ and letting the (Y,Z) coordinates of point $R_0$, where seed Ray #0 intersects front surface 102 and refracts, be $(-b\cos(\theta), b\sin(\theta))$, such that $R_0$ lies in the Abbe sphere. Then $A_0$ and $X_0$ must necessarily coincide with $R_0$.

In step 1408, chose the Z position along the optical axis by choosing the Z coordinate $Z_2$ of $B_0$. In step 1410, propagate Ray #0 (i.e., based on Snell's law and the principals of ray optics) from $A_0$ to intersect with the back surface. In step 1412, determine the Y coordinate of point $B_0$ where Ray #) intersects rear surface and reflects. In step 1414, require that the seed ray retroreflects from the back surface towards the front surface. In step 1416, determine $kB_0$, the slope of the surface tangent at $B_0$. For example, in terms of the angles shown in FIG. 15, $kB_0=\tan(\beta)=(c\tan(2\alpha)c\tan(\theta)-1)/(c\tan(\theta)+c\tan(2\alpha))$.

In step 1418, propagate the seed ray back to the front surface and, in step 1420, require total internal reflection of the seed ray from the front surface toward P the center of the Abbe sphere. Based on this requirement, in step 1422 determine $X_0$ the slope of the surface tangent at $X_0$. For example, in terms of the angles shown in FIG. 15, $kX_0=\tan(\alpha)=((n_0/n_1)+\cos(\theta))/\sin(\theta)$.

In step 1424, based on $X_0$, $B_0$, and $kX_0$, $kB_0$, extend the front and back surfaces at points $X_0$, $B_0$ a small distance along the surface tangents. In step 1426, propagate N additional parallel rays to iteratively determine the complete shapes of the front and back surface. For example, in a first iteration:

a. Determine $X_{n+1}$ by extending the front surface along $kX_n$ direction for a small step;

b. Determine $An_{+1}$ by intersecting line $PX_{n+1}$ with the Abbe sphere;

c. Determine $R_{n+1}$ by interesting Ray #(n+1) with the front surface;

d. Using Snell Law to determine Ray $R_{n+1}B_{n+1}$;

e. Determine $B_{n+1}$ by intersecting Ray $R_{n+1}B_{n+1}$ with the extension of the rear surface along the $kB_n$ direction;

f. Determine $KB_{n+1}$ such that Ray $R_{n+1}B_{n+1}$ reflects back towards $X_{n+1}$;

g. Determine $kX_{n+1}$ such that Ray $B_{n+1}X_{n+1}$ reflects towards P;

These steps may then be repeated until the whole surfaces are constructed. Once the complete surfaces are determines in the Y-Z plane, they may be rotated about the optical Z axis to provide a complete three dimensional shape for the concentrator.

Note that the above process provides a number of free parameters (e.g., b, θ, $Z_2$). This provides a great deal of flexibility in choice of design parameters. Further, the process is straightforward and not computationally intensive. For example, Table 1 contains a simple exemplary script for implementing a process of the type described above in the well known Scilab scientific computing environment (available at "http://www.scilab.org").

TABLE 1

Exemplary Script

```
//*************************************************************
//*************************************************************
//********************************
//********* This program is to construct a TIR aplanatic CPV
according to the algorithm developed by UCM group.
//********* The construction is simply on a 2D surface (XY
plane) due to rotational symmetry.
//********* The convention used in the codes for the two
constructed surfaces are as following:
//********* (Xc3, Rc3) and kc3 are the XY coordinates and the
slope of the front surface (corrector), respectively;
//********* (Xp3, Rp3) and kp3 are the XY coordinates and the
slope of the back surface (primary mirror), respectively.
//********* Users can assign values to the following two free
parameters:
//*********       (1) u: initial separation of the front and back
surface along the X direction;
//*********       (2) phim: maximum acceptance angle that the cell
can take.
//********* The resolution of the built surfaces is controlled
by NumProfile (default is 1000), which specifies how dense the
surfaces would be sampled.
//********* The result is plotted as a graph by default
(pfile=0), user can choose to also output the results to a txt
file by letting pfile=1.
//*********  ------------------------------------------------
-----------------------------------------------------------
-------
//*************************************************************
//*************************************************************
//********************************
// Display mode
mode(0);
// Display warning for floating point exception
ieee(1);
//****** define functions *********
//given two lines (y-y1)=k1*(x-x1), (y-y2)=k2*(x-x2), return
the cross point of the two lines (x3,y3)
function [x3,y3]=linecross(x1,y1,k1,x2,y2,k2)
    x3=-(-y2+y1+k2*x2-k1*x1)/(k1-k2);
```

TABLE 1-continued

Exemplary Script

```
    y3=-(k1*(k2*x2-y2)+k2*y1-k1*k2*x1)/(k1-k2);
endfunction
//given two points (x1,y1),(x2,y2), return slope k of the line
that connects the two points
function [k]=slope2p(x1,y1,x2,y2)
    k=(y2-y1)/(x2-x1);
endfunction
//given two points (x1,y1),(x2,y2), return the slope k of the
line perpendicular to the line that connects the two points
function [k]=nslope2p(x1,y1,x2,y2)
    k=-(x2-x1)/(y2-y1);
endfunction
//given the slope k1,k2 of two rays, return the slope km of a
mirror that reflects one ray to the other
function [km]=mirrorslope10(k1,k2)
    alfa1=atan(k1);
    alfa2=atan(k2);
    bia=alfa2-alfa1;
    km=tan(alfa1+bia/2+%pi/2);
endfunction
//******* end of define functions ********
// *** program control variables ***//
pfile=0; //weather to print the results to a txt file. 0:no,
1:yes
NumProfile = 1000; //how many points on the constructed
surfaces
// *** end of control variables ***//
// *****constants ********
n0=1; //refractive index of air
n1=1.5249; //refractive index of Schott BK270 at 550 nm
b=1;     // radius of Abbe sphere
// ***** end of constants *****
// ****** free parameters *******
u=b*0.0065; // u: initial separation of the front and back
surface along the X direction
phim=61/180*%pi; // maximum acceptance angle
v=b*cos(phim); // v: front surface initial displacement along
X direction
// ***** end of free parameters ******
//***** increment of each step in y direction *****//
phiMin=1e-20; phiMax=phim;
SinPhiMin=sin(phiMin);SinPhiMax=sin(phiMax);
SinPhiStep=(SinPhiMax-SinPhiMin)/NumProfile;
// *** the starting points and the initial slope of both
surfaces
    ka=(n0/n1+cos(phim))/sin(phim);
    alfa=atan(ka);
    ku=tan(2*alfa+phim-%pi/2);
    Xc3(NumProfile)=-v;
    Rc3(NumProfile)=SinPhiMax;
    Xp3(NumProfile)=Xc3(NumProfile)+u;
    Rp3(NumProfile)=SinPhiMax-u/ku;
    kc3(NumProfile)=ka;
    kp3(NumProfile)=ku;
// iterates to construct the new portions
for i=(NumProfile-1):-1:1
    hhh=SinPhiMin+(i)*SinPhiStep; //y coord of the new front
portion
//coords of the new front portion
[Xc3(i),Rc3(i)]=linecross(Xc3(i+1),Rc3(i+1),kc3(i+1),0,hhh,0);
//Abbe angle
    phi=-atan(Rc3(i)/Xc3(i));
//height of Abbe ray
    h=b*sin(phi);
//find the place where the Abbe ray interacts the front
surface
    for j=NumProfile:-1:i
        if h>Rc3(j) then hpl=j; break; end;
    end;
    auxs=kc3(hpl+1);
    hx=Xc3(hpl+1)+(h-Rc3(hpl+1))/auxs; // x coord, y is h
// refraction on the front surface, determine the slope of the
refracted ray
    auxs=-1/kc3(hpl+1);
    alfai=atan(auxs);//incident angle
    alfao=asin(n0*sin(alfai)/n1); // refraction angle
    kRefractedRay=tan(atan(auxs)-alfao); //slope of the
refracted ray
// coord of the new back portion is determined by extending
the existing portion (slope) and then intersecting with the
refracted ray
[Xp3(i),Rp3(i)]=linecross(hx,h,kRefractedRay,Xp3(i+1),Rp3(i+1),
kp3(i+1));
// Determine the slope of the back portion and the front
portion
    klink=slope2p(Xc3(i),Rc3(i),Xp3(i),Rp3(i));//klink is the
slope of the line connects the two points
    [kp3(i)]=mirrorslope10(kRefractedRay,klink);
    [kc3(i)]=mirrorslope10(-tan(phi),klink);
end
//********** plot the profiles******************
plot(Xc3, Rc3, Xp3,Rp3);
set(gca( ),"isoview","on");
mtlb_grid;
//**********output to a txt file **********************
if pfile==1 then
    BacksurfaceShift=0.2; //**********accomodate to lightool
lens spline sweep
    u=file('open','.\result.txt','unknown');
    fprintf(u,'%f,%f,%f,%f\n',0,-Xc3(1),0,Xp3(1)-
BacksurfaceShift);
    for i=1:(NumProfile/500):NumProfile
        fprintf(u,'%f,%f,%f,%f\n',Rc3(i),-Xc3(i),Rp3(i),Xp3(i)-
BacksurfaceShift);
    end;
    i=NumProfile;
    fprintf(u,'%f,%f,%f,%f\n',Rc3(i),-Xc3(i),Rp3(i),Xp3(i)-
BacksurfaceShift);
    file('close',u);
end;
```

Any suitable manufacturing technique may be employed to manufacture concentrators based on designs produced using the above described techniques. For example, process 1400 may output the concentrator design in the form of computer instructions to be implemented on one or more automated manufacturing devices.

It is to be understood that the above described devices may include any suitable materials. Surfaces of concentrator 100 may include any suitable optical coating (e.g., anti-reflective coating) or other treatment. Although one-way light admitting surface portions which employ TIR have been described, any other suitable techniques known in the art may be employed to selectively provide one-way light admission.

Also disclosed herein is a method of concentrating light using a concentrator of the type disclosed herein. In various embodiments include directing light from a source onto the concentrator to be concentrated in a concentration region. An absorber may be positioned in or near the concentration region to absorb concentrated light. The absorber may be used to convert the concentrated light energy to another for of energy, e.g., electrical, thermal, chemical, or mechanical energy. Various embodiment may include cooling the concentrator or absorber, e.g., by circulation of fluid.

One or more or any part thereof of the techniques described herein can be implemented in computer hardware or software, or a combination of both. The methods can be implemented in computer programs using standard programming techniques following the method and figures described herein. Program code is applied to input data to perform the functions described herein and generate output information. The output information is applied to one or more output devices such as a display monitor. Each program may be implemented in a high level procedural or object oriented programming language to communicate with a computer system. However, the programs can be implemented in assembly or machine language, if desired. In any case, the language can be a compiled or interpreted language. Moreover, the program can run on dedicated integrated circuits preprogrammed for that purpose.

Each such computer program is preferably stored on a storage medium or device (e.g., ROM or magnetic diskette) readable by a general or special purpose programmable computer, for configuring and operating the computer when the storage media or device is read by the computer to perform the procedures described herein. The computer program can also reside in cache or main memory during program execution. The analysis method can also be implemented as a computer-readable storage medium, configured with a computer program, where the storage medium so configured causes a computer to operate in a specific and predefined manner to perform the functions described herein.

A number of embodiments of the invention have been described. Nevertheless, it will be understood that various modifications may be made without departing from the spirit and scope of the invention.

As used herein the term "light" and related terms (e.g., "optical") are to be understood to include electromagnetic radiation both within and outside of the visible spectrum, including, for example, ultraviolet and infrared radiation.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A method for designing an imaging, aplanatic optical concentrator comprising a front surface with a one-way light admitting portion, a back surface with a reflective portion, and an interior region of refractive material disposed therebetween, the method comprising:
   determining shapes of the front and back surfaces by:
      defining an Abbe sphere with radius b;
      defining an initial ray parallel to an optical axis of the concentrator, wherein the initial ray is incident upon the front surface at a position for an initial front surface point located on the Abbe sphere;
      selecting a position along the optical axis for an initial back surface point;
      determining a surface tangent slope at each of the initial front surface point and the initial back surface point by requiring that light from the initial ray:
         refracts at the initial front surface point,
         propagates along a propagation path through the interior region to the initial back surface point,
         reflects from the initial back surface point,
         propagates back along the same propagation path to the initial front surface point,
         reflects from the initial front surface point due to total internal reflection, and
         propagates to a center of the Abbe sphere; and
   iteratively determining positions and tangent slopes at additional front and back surfaces points based on the positions of and surface tangent slopes at the initial front and back surface points.

2. The method of claim 1, wherein determining the shape of the front and back surfaces comprises:
   determining cross sectional shapes of the front and back surfaces; and
   defining the shape of the front and back surfaces as a rotation of the cross sectional shapes around the optical axis.

3. The method of claim 1, comprising the steps of:
   defining a coordinate system with orthogonal axes Y and Z and intersecting at point P, where Z corresponds to an optical axis of the concentrator;
   defining an Abbe sphere with radius b centered at P;
   defining a series of N light rays Ray #i, where i=0, 1, 2, . . . N−1, said rays traveling parallel to the Z axis to intersect the front surface of the concentrator, and wherein
      Ai is a point where parallel Ray #i intersects the Abbe sphere;
      Ri is a point where parallel Ray #i intersects the front surface and refracts;
      Bi is a point where Ray #i intersects the back surface and reflects;
      Xi is a point where Ray #i intersects the front surface a second time and reflects;
      kBi is a slope of a surface tangent at Bi;
      kXi is a slope of a surface tangent at Xi;
   selecting an angle θ;
   requiring that (Y, Z) coordinates of R0 be (b sin (θ)) such that R0 lies in the Abbe sphere and A0 and X0 coincide with R0;
   selecting a Z coordinate of B0;
   determining kX0 based on a relation kX0=tan (α)=(((n0/n1)+cos (θ))/sin (θ), where n0 is an index of refraction of a media surrounding the concentrator and n1 is an index of refraction of the refractive material;
   determining kB0 based on a relation kB0=(cotan (2α) cotan (θ)−1)/(cotan (θ)+cotan (2 α));
   constructing the front and back surfaces by iteratively determining Xi+1 and Bi+1 for i=0, 1, 2, . . . , N−2, said iteratively determining comprising the steps of:
      determining Xi+1 by extending the front surface along a kXi direction for a small step;
      determining Ai+1 as an intersection of the line from point P to point Xi+1 with the Abbe sphere;
      determining Ri+1 as an intersection of Ray #(i+1) passing through the Abbe sphere at Ai+1 with the front surface;
      determining a path of propagation of light from Ray #(i+1) from point Ri+1 through the interior region to the back surface;
      determining Bi+1 by intersecting the path of propagation of light from Ray #(i+1) from point Ri+1 with a line extending along a kBi direction;
      determining kBi+1 such that a ray of light from Ri+1 to Bi+1 reflects at Bi+1 back towards Xi+1;
   determining kXi+1 such that a ray of light from Bi+1 to Xi+1 reflects at Xi+1 towards P.

4. The method of claim 1, further comprising, for each point on the front surface, providing reflective material on a side of the front surface facing the interior region if a ray of light reflected from the back surface through the interior region onto the point does not meet the condition for total internal reflection.

* * * * *